United States Patent
Skjetne et al.

(10) Patent No.: US 9,038,433 B2
(45) Date of Patent: May 26, 2015

(54) PRESSURE COMPENSATOR FOR A SUBSEA DEVICE

(71) Applicant: Siemens Aktiengesellschaft, Munich (DE)

(72) Inventors: Arve Skjetne, Trondheim (NO); Baard Jonas Wigestrand, Trondheim (NO)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 340 days.

(21) Appl. No.: 13/729,126

(22) Filed: Dec. 28, 2012

(65) Prior Publication Data
US 2013/0167962 A1     Jul. 4, 2013

(30) Foreign Application Priority Data
Dec. 28, 2011   (EP) ..................... 11195885

(51) Int. Cl.
| | | |
|---|---|---|
| *H01F 27/14* | (2006.01) | |
| *F16L 55/04* | (2006.01) | |
| *H05K 5/06* | (2006.01) | |
| *E21B 43/01* | (2006.01) | |

(52) U.S. Cl.
CPC ............ *F16L 55/04* (2013.01); *H01F 27/14* (2013.01); *H05K 5/068* (2013.01); *E21B 43/01* (2013.01)

(58) Field of Classification Search
CPC ... F15B 2201/3153; F15B 1/103; H01F 27/14
See application file for complete search history.

(56) References Cited

U.S. PATENT DOCUMENTS

| | | | | |
|---|---|---|---|---|
| 3,765,446 | A  * | 10/1973 | Livingston ................... | 137/504 |
| 4,997,009 | A  * | 3/1991 | Niikura et al. .................. | 138/30 |
| 5,797,430 | A  * | 8/1998 | Becke et al. ..................... | 138/30 |
| 6,405,760 | B1 * | 6/2002 | Tranter et al. ................... | 138/31 |
| 8,439,080 | B2 * | 5/2013 | Uusipaikka ..................... | 138/30 |
| 2003/0075225 | A1* | 4/2003 | Dinkel et al. .................... | 138/31 |
| 2004/0051615 | A1* | 3/2004 | Hafskjold et al. .............. | 336/57 |
| 2007/0074872 | A1 | 4/2007 | Du et al. ........................ | 166/369 |
| 2008/0302115 | A1* | 12/2008 | Eknes et al. .................... | 62/183 |
| 2010/0308589 | A1* | 12/2010 | Rohrer ............................ | 290/53 |

FOREIGN PATENT DOCUMENTS

| | | | | |
|---|---|---|---|---|
| DE | 1262438 B | | 3/1968 | ............. H01F 27/14 |
| DE | 19636456 A1 | | 3/1998 | ............. H01F 27/14 |
| DE | 102006008175 A1 | * | 8/2007 | ................ F15B 1/02 |
| EP | 1384899 A2 | * | 1/2004 | ................ F15B 1/10 |

(Continued)

OTHER PUBLICATIONS

Russian Decision on Grant, Application No. 2012152708, 12 pages, Jan. 14, 2014.

*Primary Examiner* — David A Rogers
(74) *Attorney, Agent, or Firm* — King & Spalding LLP

(57) ABSTRACT

A pressure compensator for a subsea device for performing a pressure compensation between an ambient medium surrounding the subsea device and a liquid medium filling a volume of the subsea device is provided. The pressure compensator has at least one outer bellow and a first chamber enclosed by the outer bellow. It further has at least one inner bellow which is arranged inside the first chamber, and a second chamber enclosed by the inner bellow. Between the outer bellow and the inner bellow, a compensation volume is confined, which is provided with a fluid connection to the volume of the subsea device.

15 Claims, 6 Drawing Sheets

(56) References Cited

FOREIGN PATENT DOCUMENTS

| | | | | |
|---|---|---|---|---|
| EP | 2169690 A1 * | 3/2010 | ............. | H01F 27/14 |
| EP | 2570585 A1 * | 3/2013 | ............. | E21B 33/038 |
| EP | 2738780 A1 * | 6/2014 | ............. | H01F 27/14 |
| GB | 1023452 A | 3/1966 | ............. | H01F 27/14 |
| GB | 2028003 A | 2/1980 | ............. | H01F 27/14 |
| RU | 2187742 C1 * | 8/2002 | | |
| SU | 1444500 A1 | 12/1988 | ............. | E21B 7/12 |
| WO | WO 2007003595 A1 * | 1/2007 | ............. | H01H 9/00 |
| WO | 2010/034880 A1 | 4/2010 | ............. | G12B 5/00 |
| WO | 2011/088840 A1 | 7/2011 | ............. | B63C 11/52 |

* cited by examiner

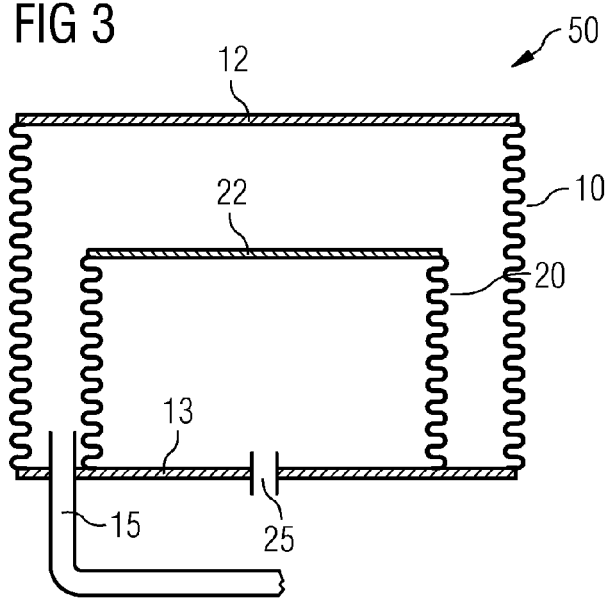
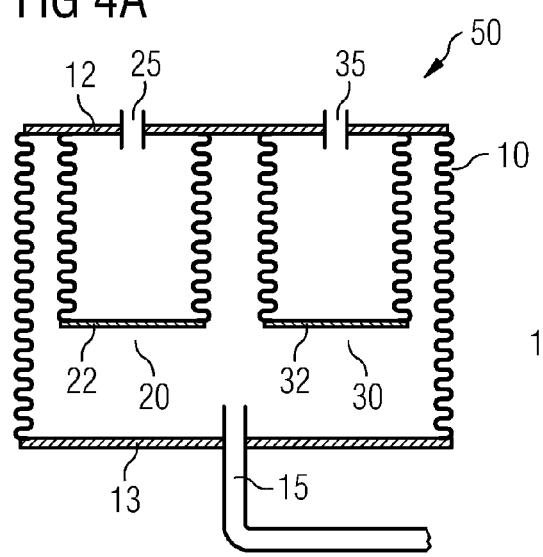
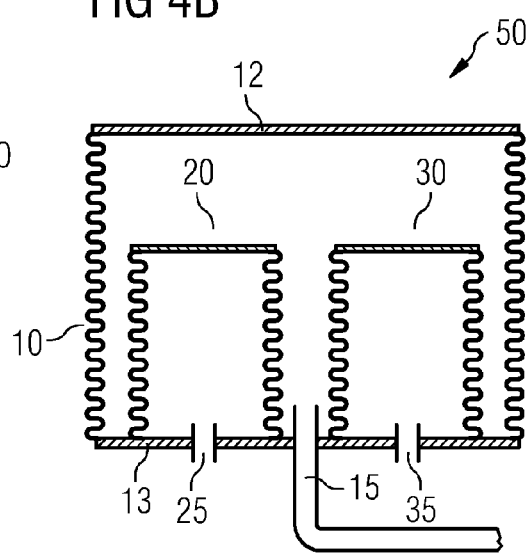

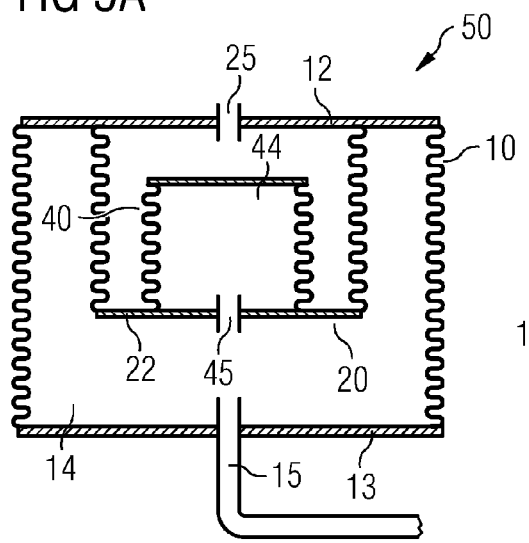
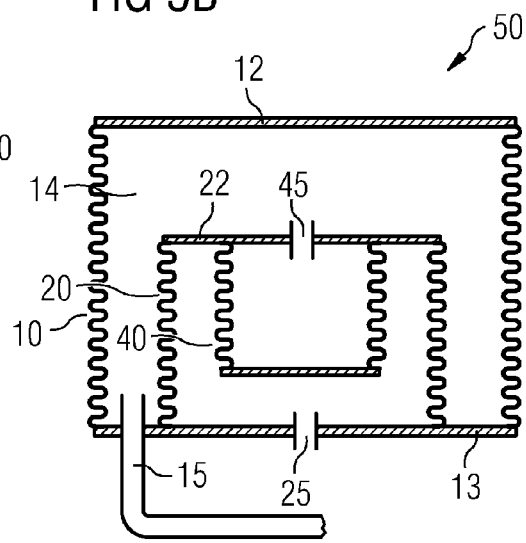
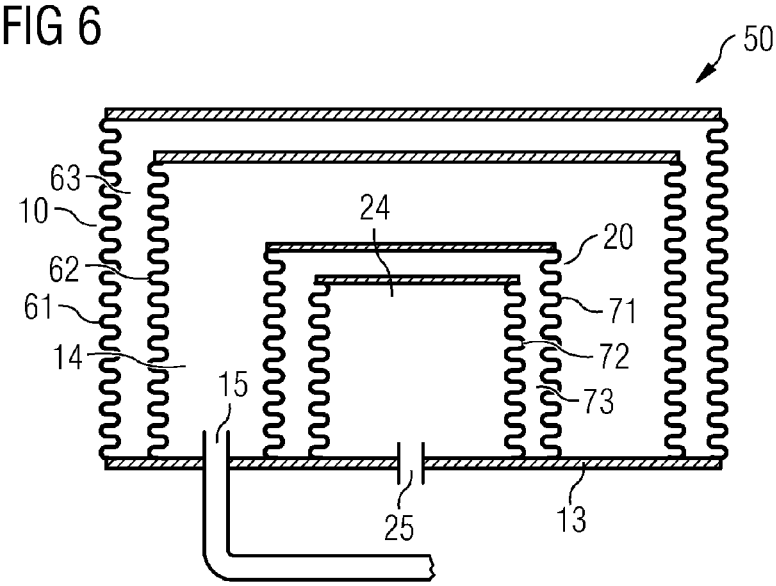

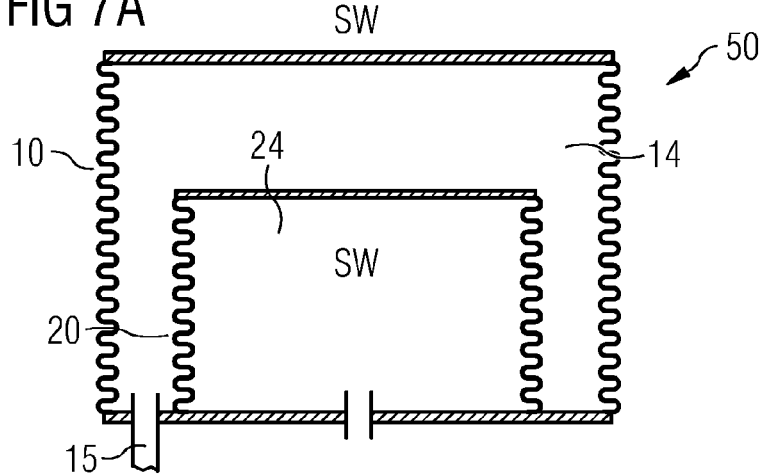
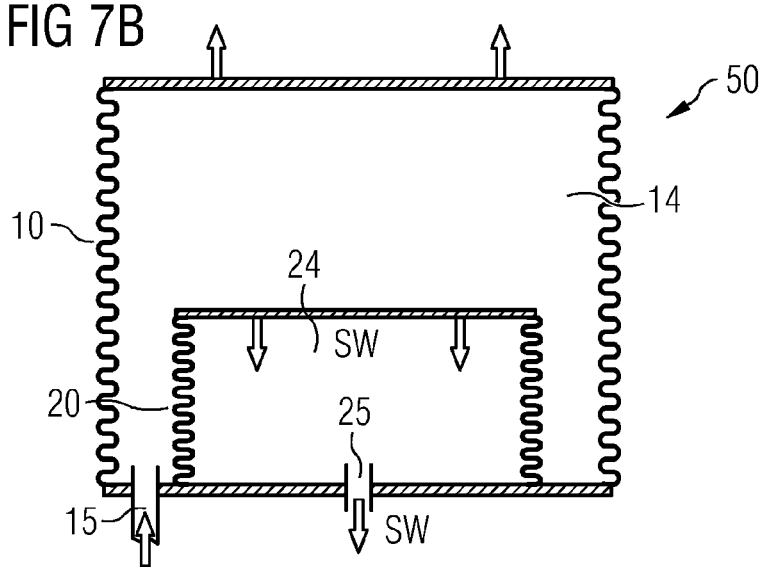
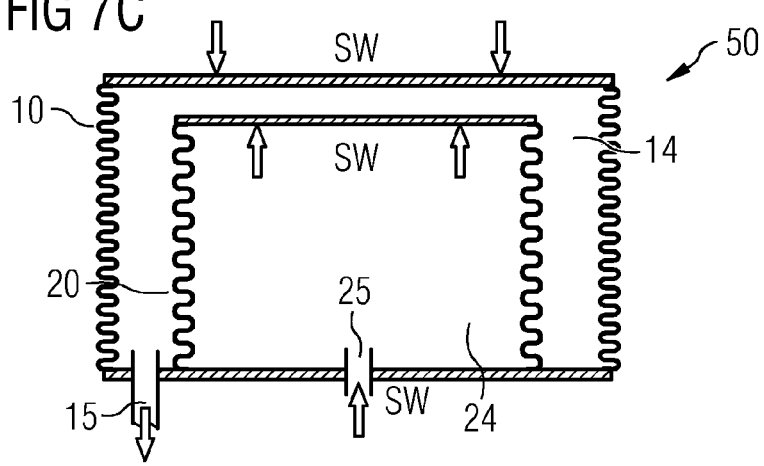

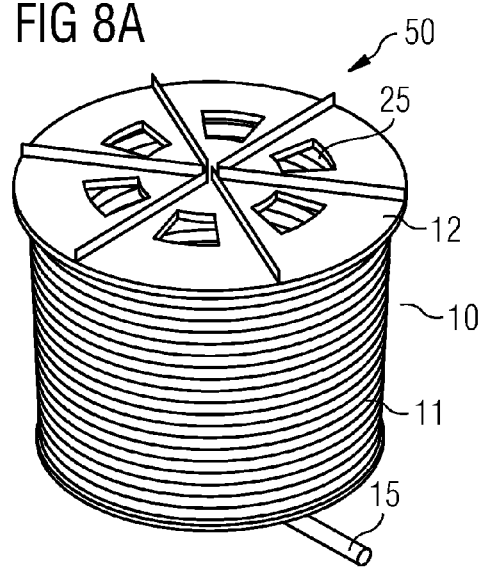
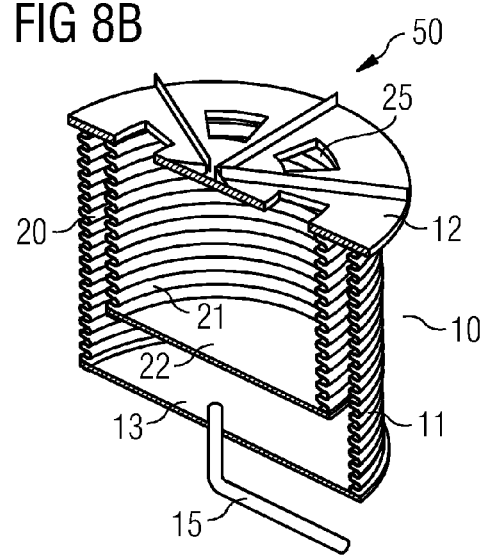
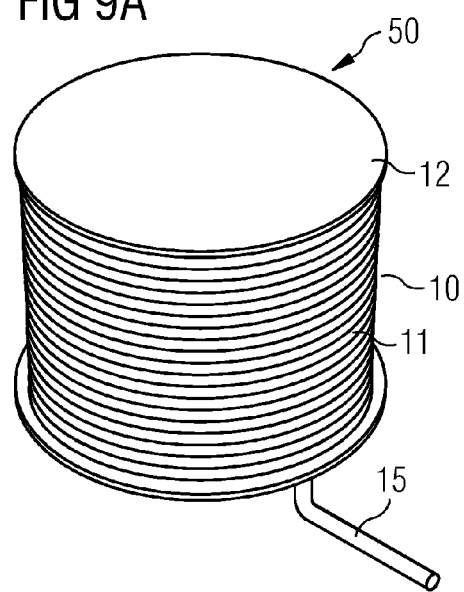
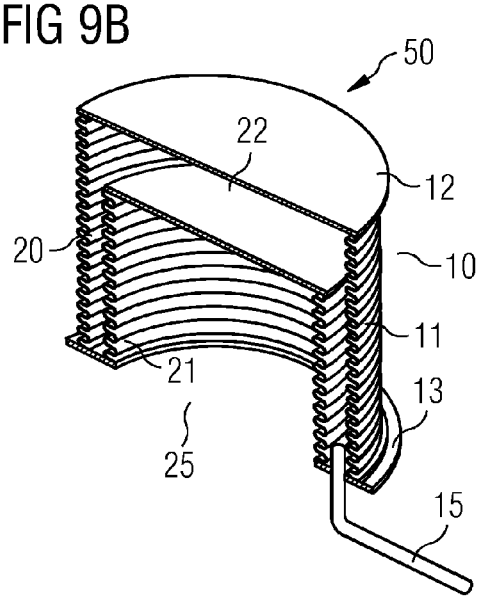

PRESSURE COMPENSATOR FOR A SUBSEA DEVICE

CROSS-REFERENCE TO RELATED APPLICATIONS

This application claims priority to EP Patent Application No. 11195885 filed Dec. 28, 2011. The contents of which is incorporated herein by reference in its entirety.

TECHNICAL FIELD

The disclosure relates to a pressure compensator for a subsea device for performing pressure compensation between an ambient medium surrounding the subsea device and a liquid medium filling a volume of the subsea device. The disclosure further relates to a subsea device comprising such pressure compensator.

BACKGROUND

Due to the increasing energy demands, offshore oil and gas production is moving into deeper waters. For ensuring an efficient and secure production, processing facilities are being installed at the ocean floor. Such subsea installations can comprise a range of components, including pumps, compressors and the like as well as a power grid for operating them. The power grid may for example comprise a subsea transformer, subsea switchgear and subsea variable speed drives. The components of the subsea installation need to be protected from the surrounding sea water, in which pressures of 300 bar or more can prevail (at installation depths of 3.000 m or more).

Two solutions were proposed for dealing with these high pressures. A pressure resistant enclosure can be provided, which has a close to atmospheric internal pressure, enabling the use of conventional electric and mechanical components. Such enclosures need to have relatively thick walls and are thus bulky and heavy, since they have to withstand high differential pressures.

Another solution is the use of pressurized (or pressure compensated) enclosures, which comprise a volume/pressure compensator which balances the pressure in the enclosure to the pressure prevailing in the ambient sea water.

The pressurized enclosure is generally filled with a liquid, and components operated inside the pressurized enclosure are made to be operable under high pressures. The pressure/volume compensator compensates for variations in the volume of the liquid filling the enclosure, which may occur due to variations in outside pressure and/or temperature. Temperature changes can be cause by internal heating, e.g. due to electric losses.

Pressure compensators may include metal bellows, rubber bellows, pistons or the like. Bellows can have the disadvantage that they are either expensive to produce, or their configuration is such that the stroke length of the bellow is limited. In the latter case, a pressure compensator for a large volume of liquid also requires large volume. For some types of bellows, the bellow needs to have a size of more than three times of the size of the compensated volume. This results in a low utilization factor of the volume of the compensator system. Furthermore, the liquid filling such pressure compensator needs to be compensated itself. Such compensator systems can thus be relatively large and heavy.

In the document WO2010/034880A1, a pressure compensator is disclosed which has a first bellows chamber that is surrounded by a second bellows chamber, the second bellows chamber forming a closed intermediate space around the first bellows chamber. A double barrier against the ingress of sea water is thus obtained, but the pressure compensation capacity is the same as if the first bellows chamber was provided by itself.

The document WO2011/088840A1 discloses a pressure compensation system which achieves a double barrier against the ingress of sea water.

It is desirable to provide a pressure compensator for use with a subsea device that can be manufactured easily and cost efficiently. It is further desirable that the pressure compensator provides security during operation and has a long lifetime. It is desirable to reduce the size of the pressure compensator, and to increase the utilization factor.

SUMMARY

In one embodiment, a pressure compensator is provided for a subsea device for performing a pressure compensation between an ambient medium surrounding the subsea device and a liquid medium filling a volume of the subsea device, the pressure compensator comprising: at least one outer bellow; a first chamber enclosed by said outer bellow; at least one inner bellow, the inner bellow being arranged inside the first chamber; a second chamber enclosed by the inner bellow; a compensation volume confined between the outer bellow and the inner bellow; a first fluid connection from the compensation volume towards the volume of the subsea device, the first fluid connection being configured so as to enable the passage of the liquid medium between the compensation volume and the volume of the subsea device; and a second fluid connection to the second chamber, the second fluid connection being configured so as to enable the passage of the ambient medium into and out of the second chamber.

In a further embodiment, the outer bellow comprises an outer cover plate and a bellow portion having two openings, the bellow portion being liquid tight sealed against the outer cover plate at one opening and against a mounting plate which forms part of the outer bellow or of the subsea device at the other opening. In a further embodiment, the inner bellow comprises an inner cover plate and a bellow portion having two openings, wherein the bellow portion of the inner bellow is liquid tight sealed against the inner cover plate at one opening and, at the other opening, is liquid tight sealed against one of the mounting plate or the outer cover plate of the outer bellow. In a further embodiment, the bellow portion of the inner bellow is sealed against the mounting plate, and wherein the second fluid connection comprises one or more openings in the mounting plate located within an area of the mounting plate that is surrounded by the bellow portion of the inner bellow. In a further embodiment, the outer bellow comprises an outer cover plate, and wherein the inner bellow comprises a bellow portion that is sealed against the outer cover plate, wherein the second fluid connection comprises one or more openings in the outer cover plate located within an area of the outer cover plate that is surrounded by the bellow portion of the inner bellow. In a further embodiment, the outer bellow comprises a bellow portion, the bellow portion being liquid tight sealed against a mounting plate forming part of the outer bellow or of the subsea device, wherein the first fluid connection comprises a fluid passage through the mounting plate. In a further embodiment, the at least one outer bellow is a formed metal bellow. In a further embodiment, the at least one inner bellow is a formed metal bellow. In a further embodiment, the formed metal bellow comprises a bellow portion that is made from a metal sheet formed into a cylindrical shape and provided with corrugations having crests which extend in circumferential direction of the cylindrical shape. In a further embodiment, the at least one outer bellow comprises a first outer bellow and a second outer bellow arranged within the first outer bellow, wherein the first outer bellow and the second outer bellow confine a first intermediate volume, wherein the first outer bellow provides a liquid tight seal between the first intermediate volume and the ambient medium, and wherein the second outer bellow provides a liquid tight seal between the first intermediate volume and the compensation volume. In a further embodiment, the at least one inner bellow comprises a first inner bellow and a second inner bellow arranged within the first inner bellow, wherein the first inner bellow and the second inner bellow confine a second intermediate volume, wherein the first inner bellow provides a liquid tight seal between the second intermediate volume and the compensation volume, and wherein the second inner bellow provides a liquid tight seal between the second intermediate volume and the ambient medium. In a further embodiment, the pressure compensator comprises at least two inner bellows arranged inside the first chamber, each of the two inner bellows enclosing a chamber and comprising a fluid connection to enable the passage of ambient medium into the respective chamber, the at least two inner bellows being arranged adjacent to each other.

In a further embodiment, the pressure compensator further comprises: at least a third bellow, the third bellow being arranged in the second chamber and enclosing a third chamber, and a third fluid connection between the compensation volume and the third chamber, the third fluid connection being configured so as to enable the passage of the liquid medium between the compensation volume and the third chamber.

In a further embodiment, the ambient medium is sea water, wherein the outer bellow is on its outer side in contact with the sea water when the pressure compensator is installed subsea, and wherein the second fluid connection is configured to enable the passage of sea water into the second chamber so that the second chamber is filled with sea water when the pressure compensator is installed subsea.

In another embodiment, a subsea device comprises an enclosure enclosing a volume, the volume being filled with a liquid medium; and a pressure compensator as disclosed above, the first fluid connection enabling the liquid medium to flow between the volume enclosed by the enclosure and the compensation volume of the pressure compensator.

BRIEF DESCRIPTION OF THE DRAWINGS

Example embodiments will be explained in more detail below with reference to figures, in which:

FIG. 3 is a schematic diagram illustrating a pressure compensator according to a further embodiment.

FIGS. 4A and 4B are schematic diagrams illustrating pressure compensators according to embodiments in which two inner bellows arranged adjacent to one another are provided.

FIGS. 5A and 5B are schematic diagrams illustrating pressure compensators according to embodiments in which a third bellow is provided inside the inner bellow.

FIG. 6 is a schematic diagram illustrating a pressure compensator according to an embodiment which is provided with a double barrier against the ambient medium.

FIGS. 7A, 7B and 7C are schematic diagrams illustrating different states of a pressure compensator during pressure compensation according to one embodiment.

FIGS. 8A and 8B are schematic diagrams showing a perspective view and a perspective sectional view of a pressure compensator in a particular implementation of the embodiment of FIG. 2.

FIGS. 9A and 9B are schematic diagrams showing a perspective view and a sectional perspective view, respectively, of a specific implementation of the pressure compensator of the embodiment of FIG. 3.

DETAILED DESCRIPTION

Figure 1:
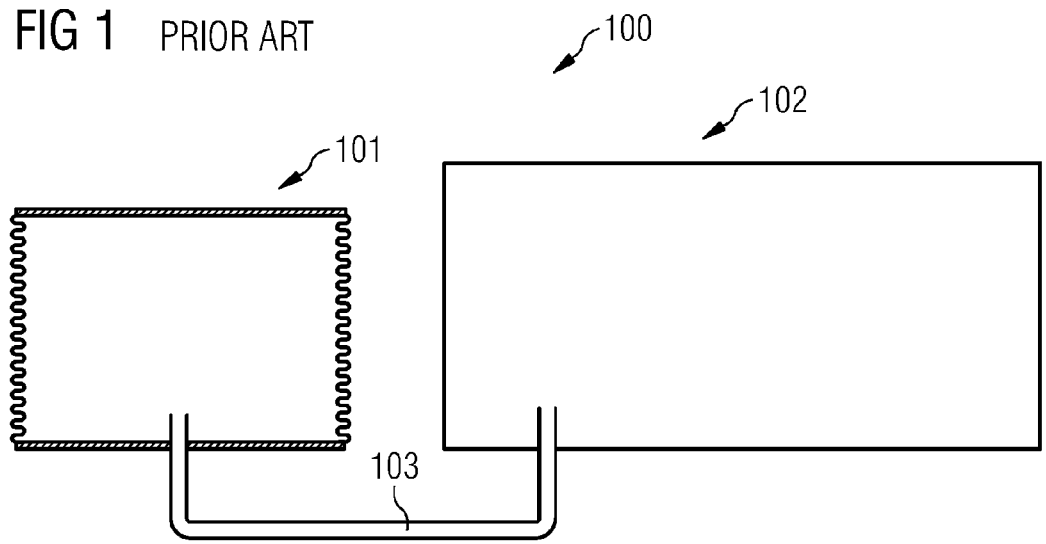
FIG. 1 is a schematic diagram illustrating a conventional pressure compensator coupled to a volume of a subsea device.

Accordingly, embodiment of the present disclosure provide an improved pressure compensator for subsea use.

One embodiment provides a pressure compensator for a subsea device for performing a pressure compensation between an ambient medium surrounding the subsea device and a liquid medium filling a volume of the subsea device. The pressure compensator comprises at least one outer bellow, a first chamber enclosed by the outer bellow, at least one inner bellow, the inner bellow being arranged inside the first chamber and a second chamber enclosed by the inner bellow. Between the outer bellow and the inner bellow, a compensation volume is confined. The pressure compensator further comprises a first fluid connection from the compensation volume towards the volume of the subsea device, the first fluid connection being configured so as to enable the passage of the liquid medium between the compensation volume and the volume of the subsea device when the pressure compensator is installed on the subsea device. A second fluid connection to the second chamber is further provided, the second fluid connection being configured so as to enable the passage of the ambient medium into and out of the second chamber when the pressure compensator is installed on a subsea device and submerged subsea.

In such configuration, the outer bellow and the inner bellow are arranged such that an expansion of the outer bellow and a compression of the inner bellow will lead to a volume increase of the compensation volume. The pressure compensator may thus achieve higher volume changes of the compensation volume as compared to a pressure compensator having only an outer bellow of the same size. Further, the dead volume of the liquid medium is reduced, since the second chamber can be filled with the ambient medium, in particular sea water, through the second fluid connection, so that the utilization factor of the pressure compensator can be increased. Since the bellows are flexible and can expand/contract, pressure differences between the ambient medium and the liquid medium can be compensated, i.e. the pressures of the ambient medium and of the liquid medium in the compensation volume can be balanced.

In an embodiment, the second fluid connection is between the second chamber and the outside of the pressure compensator.

In an embodiment, the outer bellow comprises an outer cover plate and a bellow portion having two openings. The bellow portion is sealed in a liquid tight manner against the outer cover plate at one opening and against a mounting plate at the other opening. The mounting plate may be part of the outer bellow, or may be part of the subsea device. As an example, the liquid tight seal may be achieved by welding. The bellow portion may have a cylindrical shape, with openings at the top and bottom.

The inner bellow may comprise an inner cover plate and a bellow portion having two openings, wherein the bellow portion of the inner bellow may be sealed in a liquid tight manner against the inner cover plate at one opening. At the other opening, it may be sealed against the mounting plate or the outer cover plate of the outer bellow. Again, the bellow portion may be cylindrical and may have openings at its top and bottom, and the liquid tight sealing may be achieved by welding.

The configuration of the pressure compensator may be such that the outer cover plate and the inner cover plate are free to move in axial direction of the respective bellow portions, the movement of the outer cover plate being independent from the movement of the inner cover plate. In such configuration, large variations of the compensation volume can be achieved, while at the same time, the absolute size of the compensation volume can be kept small.

In an embodiment, the bellow portion of the inner bellow is sealed against the mounting plate, and the second fluid connection comprises one or more openings in the mounting plate located within an area of the mounting plate that is surrounded by the bellow portion of the inner bellow. The one or more openings may for example comprise a single opening having a diameter that is only slightly smaller than the diameter of the bellow portion of the inner bellow. Ambient medium can thus easily enter the second chamber.

In a further embodiment, the outer bellow comprises an outer cover plate, and the inner bellow comprises a bellow portion that is sealed against the outer cover plate, wherein the second fluid connection comprises one or more openings in the outer cover plate located within an area of the outer cover plate that is surrounded by the bellow portion of the inner bellow. In such configuration, the entering of the ambient medium into the second chamber is facilitated even if the pressure compensator is directly mounted onto an enclosure of the subsea device, e.g. via the mounting plate.

The outer bellow may comprise a bellow portion, the bellow portion being liquid tight sealed against a mounting plate forming part of the outer bellow or of the subsea device, wherein the first fluid connection comprises a fluid passage through the mounting plate. This way, the flow of the liquid medium between the volume of the subsea device and the compensation volume can be facilitated, for example when the mounting plate forms part of an enclosure of the subsea device, or is directly mounted to such enclosure.

The fluid passage may comprise or consist of a conduit, a duct, a channel, a pipe, a tubing or the like, it comprises a penetration through the mounting plate enabling the flow of liquid therethrough.

In some embodiments, the at least one outer bellow and/or the at least one inner bellow is a formed metal bellow. Using a formed metal bellow may make the pressure compensator robust and furthermore cost-efficient to manufacture. By the configuration of the pressure compensator, disadvantages which may result from a limited stroke of a formed metal bellow may be mitigated, since the pressure compensator achieves large changes of the compensation volume and a high utilization factor even with bellows having limited stroke.

The formed metal bellow may comprise a bellow portion that is made from a metal sheet formed into a cylindrical shape and provided with corrugations. The crests of the corrugations may extend in circumferential direction of the cylindrical shape, so that an expansion/compression of the bellow portion in its axial direction becomes possible. The bellow may thus be referred to as a corrugated bellow.

In an embodiment, the at least one outer bellow comprises a first outer bellow and a second outer bellow arranged within the first outer bellow. The first outer bellow and the second outer bellow confine a first intermediate volume. The first outer bellow provides a liquid tight seal between the first intermediate volume and the ambient medium and the second outer bellow provides a liquid tight seal between the first intermediate volume and the compensation volume. In this configuration, a double barrier against the ambient medium can be provided at the outer bellow. Each outer bellow can comprise a bellow portion and a cover plate, both bellow portions being mounted to the same mounting plate. The cover plates may be configured to move freely and independently from each other. This way, the intermediate volume can be filled with a liquid, which is pressure compensated both against the ambient medium and the liquid medium in the compensation volume.

Similarly, the at least one inner bellow may comprise a first inner bellow and a second inner bellow arranged within the first inner bellow. The first inner bellow and the second inner bellow may confine a second intermediate volume. The first inner bellow may provide a liquid tight seal between the second intermediate volume and the compensation volume, and the second inner bellow may provide a liquid tight seal between the second intermediate volume and the ambient medium. Each of the first and second inner bellows may comprise a cover plate and a bellow portion, both bellow portions being mounted to the same mounting plate of the outer bellow, or to the cover plate of the outer bellow (in particular the second outer bellow). The cover plates of both inner bellows may again be configured to move freely and independently from each other. A doubled barrier against the ingress of the ambient medium which may fill the second chamber when the pressure compensator is installed subsea is thus provided. The second intermediate volume can be filled with a liquid which is pressure compensated against the ambient medium and against the liquid medium in the compensation volume.

By implementing both of the above configurations, a full double barrier sealing of the compensation volume against the ambient medium can be achieved. Ambient medium will only enter the intermediate volume, should one of the bellows being in contact with the ambient medium fail.

In an embodiment, the pressure compensator may comprise at least two inner bellows arranged inside the first chamber, each of the two inner bellows enclosing a chamber and comprising a fluid connection to enable the passage of ambient medium into the respective chamber, the at least two inner bellows being arranged adjacent to each other. In some applications, such configuration may further increase the utilization factor.

The pressure compensator may comprise at least a third bellow, the third bellow being arranged in the second chamber and enclosing a third chamber. A third fluid connection may be provided between the compensation volume and the third chamber, the third fluid connection being configured so as to enable the passage of the liquid medium between the compensation volume and the third chamber. Volume changes of the compensation volume which can be achieved with the pressure compensator may be made even larger in such configuration. This is particularly advantageous when using formed metal bellows having a limited stroke.

The ambient medium may be sea water, and the outer bellow may on its outer side be in contact with the sea water when the pressure compensator is installed subsea. The second fluid passage may be configured to enable the passage of seawater into the second chamber so that the second chamber is filled with seawater when the pressure compensator is installed subsea. The compensation volume may be filled with a liquid, in particular with a dielectric liquid, such as oil.

A further embodiment provides a subsea device comprising an enclosure enclosing a volume, the volume being filled with a liquid medium and a pressure compensator in any of the above described configurations. The first fluid connection of the pressure compensator enables the liquid medium to flow between the volume enclosed by the enclosure and the compensation volume of the pressure compensator. In particular when using a configuration of the pressure compensator having formed metal bellows, pressure compensation of the volume of the subsea device can be achieved in a cost-efficient manner, while the size of the dead volume of the pressure compensator can be reduced.

The bellow portion of the outer bellow of the pressure compensator may have a cylindrical shape having a diameter in a range between about 0.5 m and about 2.5 m. In uncompressed/unextended state, the bellow portion may furthermore have a height between about 0.5 m and about 2.5 m. The inner bellow may be sized such that the ratio of the volume enclosed by the inner bellow and the volume enclosed by the outer bellow lies within a range of about 0.3 to about 0.9.

In the following, the embodiments illustrated in the accompanying drawings are described in more detail. It should be clear that the following description is only illustrative and non-restrictive. The drawings are only schematic representations, and elements in the drawings are not necessarily to scale with each other.

FIG. 1 illustrates a subsea system 100 comprising a conventional pressure compensator 101. The illustrated conventional pressure compensator 101 consists of a single bellow confining a compensation volume which is connected via pipe 103 to the inner volume of a subsea enclosure 102. In particular when using a formed metal bellow in the pressure compensator 101, the stroke of the bellow is rather limited, resulting in a large absolute volume of pressure compensator 101 for a given volume variation that is to be achieved by the pressure compensator. Pressure compensator 101 thus requires a lot of space and, due to its size, is relatively heavy. It needs to be filled with a large volume of liquid, which itself needs to be compensated for volume variations. In particular, the bellow of pressure compensator 101 may be required to have a size of more than three times of the compensated volume in enclosure 102, due to the low utilization factor of the compensator. The utilization factor to the total volume of the pressure compensator may be defined as the ratio of the achievable volume variation.

Figure 2:
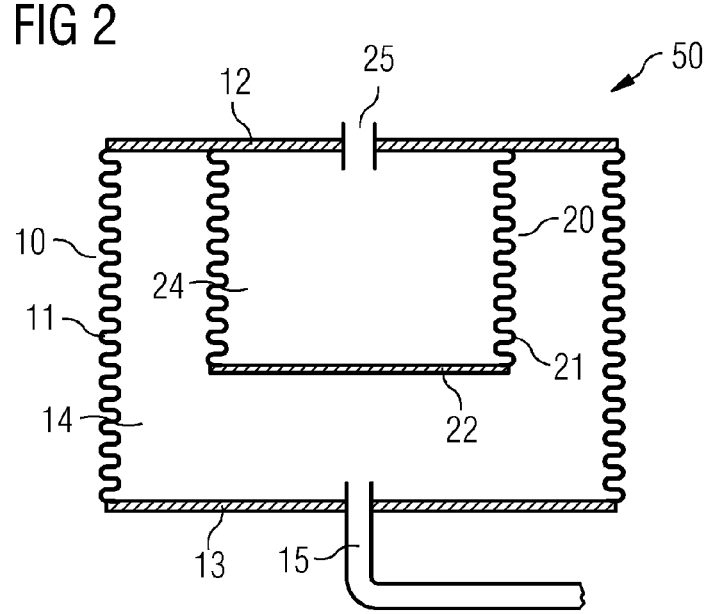
FIG. 2 is a schematic diagram illustrating a pressure compensator according to one embodiment.

FIG. 2 shows a sectional side view of a pressure compensator 50 in accordance with one embodiment. Pressure compensator 50 comprises a first bellow 10 including a bellow portion 11, the upper part of which is sealed against the cover plate 12 and the lower part of which is sealed against the mounting plate 13. A liquid tight seal may be provided by welding the bellow portion 11 to the respective plate. In the mounting plate 13, a first fluid connection 15 is provided. Fluid connection 15 provides a fluid communication between the volume enclosed by the outer bellow 10 and a volume enclosed by an enclosure of a subsea device, for which the pressure compensator 50 provides a volume/pressure compensation. First fluid connection 15 may be a simple through connection, i.e. a penetration of the mounting plate 13, or it may comprise a pipe, a tube, a duct, a channel, a conduit or the like.

Pressure compensator 50 further comprises an inner bellow 20 which is arranged in a chamber enclosed by the outer bellow 10. The inner bellow 20 comprises a bellow portion 21 which is sealed against the inner cover plate 22 of inner bellow 20 and against the outer cover plate 12 of the outer bellow 10. A liquid tight seal between the bellow portion 21 and the respective cover plate may again be obtained by welding.

A second fluid connection 25 is provided between a second chamber 24 enclosed by the inner bellow 20 and the outside of pressure compensator 50. The second fluid connection 25 is configured so that an ambient medium surrounding the pressure compensator 50, such as seawater, can enter through the second connection 25 into the second chamber 24. Due to the liquid tight seals provided at the periphery of the bellow portion 21, seawater can not enter into the compensation volume 14, which is confined between the inner bellow 20 and the outer bellow 10.

The outer bellow 10 encloses a first chamber, in which the inner bellow 20 is arranged. Due to the liquid tight seals provided at the periphery of the outer bellow portion 11 and the inner bellow portion 21, a volume is confined between the respective bellow portions, the outer cover plate 12, the inner cover plate 22 and the mounting plate 13. This confined compensation volume 14 is available for pressure compensation, it can be varied considerably by extension and compression of the outer and inner bellows. The compensation volume 14 is filled with a liquid, in particular a dielectric liquid, which can enter and flow out of the compensation volume 14 via the first fluid connection 15. Ambient medium, such as seawater, can not enter the compensation volume 14.

An enclosure of a subsea device encloses a volume in which for example an electric component can be arranged. The volume is in flow communication with the compensation volume 14 via the first fluid connection 15. If the liquid in this volume of the subsea enclosure expands, for example due to a rise in temperature, the liquid can enter the compensation volume 14. By an expansion of outer bellow 10 and/or a compression of the inner bellow 20, the compensation volume 14 is enlarged, so that the additional liquid can be taken up by the pressure compensator 50 without causing a drastic increase in pressure. In another example, if the ambient pressure around pressure compensator 50 increases, for example when installing a subsea device to which pressure compensator 50 is mounted at great water depths, the volume of the liquid will decrease due to the increasing pressure and/or due to the decreasing temperature. The decreasing volume of the liquid can be compensated by a compression of outer bellow 10 and an extension of inner bellow 20, leading to a decreasing compensation volume 14. By the flexible bellow portions 11, 21, any pressure changes in the ambient medium are directly transduced to the liquid filling compensation volume 14, so that the pressure of the liquid is balanced to the pressure of the ambient medium. Note that a slight overpressure may be maintained in the compensation volume 14, for example by biasing (pre-loading) the bellows or the like. Biasing may for example occur by the weight of the cover plates, by a spring applying a force to a bellow, by using the bellow as a spring, or by any other means. A slight overpressure will prevent the entering of ambient medium into the volume of the subsea device, since a slight overpressure of the liquid will result in the liquid being pushed out through any leak. This also facilitates the detection of a leak.

In the arrangement of FIG. 2, pressure compensator 50 has the compensation capacity of both the inner bellow and the outer bellow, without requiring more space than the outer bellow 10 itself. Also, the volume of liquid required in the compensation volume 14 is relatively small, while relatively large volume changes are enabled. The pressure compensator 50 of FIG. 2 can thus make use of formed metal bellows, which are easy and cost-efficient to manufacture, while the total size of the pressure compensator that is required for a particular volume of the subsea device can be kept comparatively small.

In the embodiments described herein, the outer bellow 10 and the inner bellow 20 are formed metal bellows, although it should be appreciated that the described configurations may also be employed with other types of bellows.

The formed metal bellow 10, 20 may be manufactured by using a sheet of metal, the peripheral edges of which are welded together so as to form a cylinder. The corresponding bellow portion may be obtained by hydro forming the metal sheet or the cylinder, e.g. using templates for the desired shape of the bellow portion. Another possibility is the use of a rolling technique in which the metal cylinder is deformed mechanically to form the corrugations of the bellow portion. Whether the corrugations are provided by hydroforming or by rolling can depend on the diameter of the metal cylinder. For larger diameters, e.g. above 1200 mm diameter, corrugations may be formed by rolling while below this diameter, they may be hydro formed.

The formed bellows may thus also be termed corrugated bellows. Compared to welded bellows, in which the corrugations are formed by welding, corrugated bellows can be more reliable in subsea applications, they are less prone to corrosion and have a higher life expectancy in repeated compression/extension cycles.

The formed metal bellow may have a stroke length of between about 10% and about 20% of its length in each way, giving a total stroke length of between about 20 to about 40%. As an example, from its operating opposition, the bellow may be stretched or compressed 15% each way. The intrinsic spring constant of the formed metal bellow may be used to generate the above mentioned slight overpressure inside the compensation volume 14.

The outer bellow of pressure compensator 50 may for example have a diameter between about 0.5 m and about 2.5 m. Note that these are only examples, and that pressure compensators having other diameter bellows may be provided.

The remaining figures show modifications of the pressure compensator 50, which are explained in more detail hereinafter. Accordingly, the above observations and explanations apply equally to the embodiments described hereinafter.

In the embodiment of FIG. 3, the inner bellow 20 is not sealed to the cover plate 12, but to the mounting plate 13. Correspondingly, the second fluid connection 25 is provided in the mounting plate 13. The second fluid connection 25 is now at the lower side of the pressure compensator 50, which can have advantages for certain configurations of the subsea device towards which pressure compensator 50 is to be connected.

FIGS. 4A and 4B show embodiments of the pressure compensator 50 in which two inner bellows 20, 30 are provided and arranged adjacent to each other. In FIG. 4A, the two inner bellows 20, 30 are sealed against the outer cover plate 12 of the outer bellow 10. For each inner bellow 20, 30, a second fluid connection 25, 35 is provided. Each inner bellow further comprises its own inner cover plate 22, 32, which can move independent from one another. It should be clear that more than two, e.g. three, four, five, . . . inner bellows may be provided in other configurations.

In FIG. 4b, the two inner bellows 20, 30 are sealed against the mounting plate 13. The configuration is thus similar to the one of FIG. 3, but with two inner bellows. It should be clear that this configuration may also have more than two inner bellows, and that the configurations of FIGS. 4a and 4b may be mixed, e.g. by having one or more bellows sealed against the cover plate 12 and by having one or more bellows sealed against the mounting plate 13.

In the configurations of FIGS. 5a and 5b, the pressure compensator 50 further comprises a third bellow 40, which is arranged inside the chamber 24 enclosed by the inner bellow 20. Furthermore, a third fluid connection 45 is provided between the chamber 44 enclosed by the third bellow 40 and the compensation volume 14. In both embodiments of FIGS. 5a and 5b, the third bellow 40 is sealed against the inner cover plate 22 of the inner bellow 20, with the third fluid connection 45 being provided in form of an opening in the cover plate 22. The configuration of FIG. 5a corresponds to the one of FIG. 2, whereas the configuration of FIG. 5b corresponds to the one of FIG. 3. In both configurations, the third bellow 40 further increases the volume variations that are possible by means of pressure compensator 50. This is due to the possibility to compress or extend the third bellow 40, thereby increasing or decreasing the volume of the chamber enclosed by the third bellow. Since this chamber is in fluid communication with the compensation volume 14, it allows for larger volume variations of the liquid filling the compensation volume 14 and the volume of the subsea device.

FIG. 6 shows an embodiment the configuration of which corresponds to the one of FIG. 3. In the embodiment of FIG. 6, a double barrier design is implemented. The outer bellow 10 comprises a first outer bellow 61 and a second outer bellow 62, each having a bellow portion and an outer cover plate. Between these bellow portions, the outer cover plates and the mounting plate 13, an outer intermediate volume 63 is confined. It is sealed against the compensation volume 14 and against the ambient medium surrounding pressure compensator 50. Similarly, the inner bellow 20 comprises a first inner bellow 71 and a second inner bellow 72. The second inner bellow 72 is arranged within the first inner bellow 71, each bellow comprising an inner cover plate. Between the inner cover plates and the bellow portions of the first and second inner bellows 71, 72 and the mounting plate 13, an inner intermediate volume 73 is confined.

The liquid in the compensation volume 14 is now protected against ambient medium surrounding the pressure compensator 50 or which may enter the second chamber 24 of the inner bellow 20 by a double barrier. Ambient medium leaking through the first outer bellow 61 or the second inner bellow 72 will thus be confined in the outer intermediate volume 63 or the inner intermediate volume 73, respectively, and will not enter the compensation volume 14. It should be clear that such double barrier configuration may also be provided in any of the other embodiments described above or further below.

FIGS. 7a to 7c illustrate with respect to the configuration of FIG. 3 the operation of the pressure compensator 50. FIG. 7a shows the equilibrium operating state, which may for example be achieved when the subsea device comprising pressure compensator 50 is installed subsea at a nominal operating depth. Both the inner bellow 20 and the outer bellow 10 have the capability of being compressed or stretched, and the liquid within compensation volume 14 may have a slight overpressure as compared to seawater (SW) surrounding pressure compensator 50 and entering the second chamber 24. Starting from the state as illustrated in FIG. 7a, a situation is now depicted in FIG. 7b in which the ambient pressure is dropped or the temperature is increased, resulting in an increase of the volume of the liquid in the subsea device. Due to the volume expansion, liquid enters the compensation volume 14 through the first fluid connection 15, which leads to a stretching of the outer bellow 10 and to a compression of the inner bellow 20, as illustrated by arrows. As the volume of the second chamber 24 is decreased, seawater is pushed out through the second fluid connection 25.

The pressure of the liquid inside compensation volume 14 applies a force in the direction of the arrows to the outer cover plate and to the inner cover plate, which is balanced by the force applied to these plates by the pressure of the ambient medium. Consequently, pressure compensator 50 provided a pressure balancing between the pressure of the ambient medium and the pressure inside compensation volume 14 (except for the above mentioned pressure biasing loading, if such is provided). Since the pressure balancing is achieved by compensating volume differences of the liquid, the pressure compensator 50 may also be termed "volume compensator".

In FIG. 7c, a situation is illustrated in which the volume of the liquid in the subsea device is decreased, e.g. due to an increase in ambient pressure or due to a decrease in temperature of the liquid. Consequently, liquid flows from the compensation volume 14 through the first fluid connection 15 into the volume of the subsea device. The compensation volume is correspondingly decreased by a compression of the outer bellow 10 and an expansion of the inner bellow 20 as indicated by arrows. The expansion of inner bellow 20 leads to seawater entering the second chamber 24 through the second fluid connection 25. Again, by changing compensation volume 14, the pressure of the liquid is equalized to the ambient pressure.

FIGS. 8a and 8b show a particular implementation of the pressure compensator 50 in the configuration of FIG. 2. In the perspective view of FIG. 8a, it can be seen that the second fluid connection 25 comprises several openings in the outer cover plate 12. Furthermore, the first fluid connecting 15 is provided in form of a pipe or hose from the mounting plate 13. This can also be seen from the sectional perspective view of FIG. 8b, showing the bellow portions 11 and 21 of the outer bellow 10 and the inner bellow 20, respectively, in more detail. Providing several openings in cover plate 12 facilitates the entering of ambient medium into the second chamber 24 of the inner bellow 20.

FIGS. 9a and 9b show a particular implementation of the pressure compensator 50 in the configuration of FIG. 3. As can be seen from the perspective view of FIG. 9a, the outer cover plate 12 is not provided with openings, which may for example prevent debris from entering the second chamber 24. The sectional perspective view of FIG. 9b shows that the mounting plate is provided with an opening providing the second fluid connection 25. The opening is surrounded by the bellow portion 21 of the inner bellow 20, it has a size that essentially corresponds to the diameter of the inner bellow portion 21. The flow of ambient medium into the second chamber surrounded by the second bellow 20 is thus essentially non-restricted. The first fluid connection 15 is again provided through the mounting plate 13, it is implemented as pipe or a hose in the example of FIG. 9.

Note that while in all of the configurations described above, the first fluid connection 15 is implemented via a penetration of the mounting plate 13, it is certainly also conceivable to provide the first fluid connection at another position, for example through the cover plate 12. Since cover plate 12 moves during pressure compensation, it is beneficial to provide the first fluid connection in the mounting plate 13.

Figure 10:
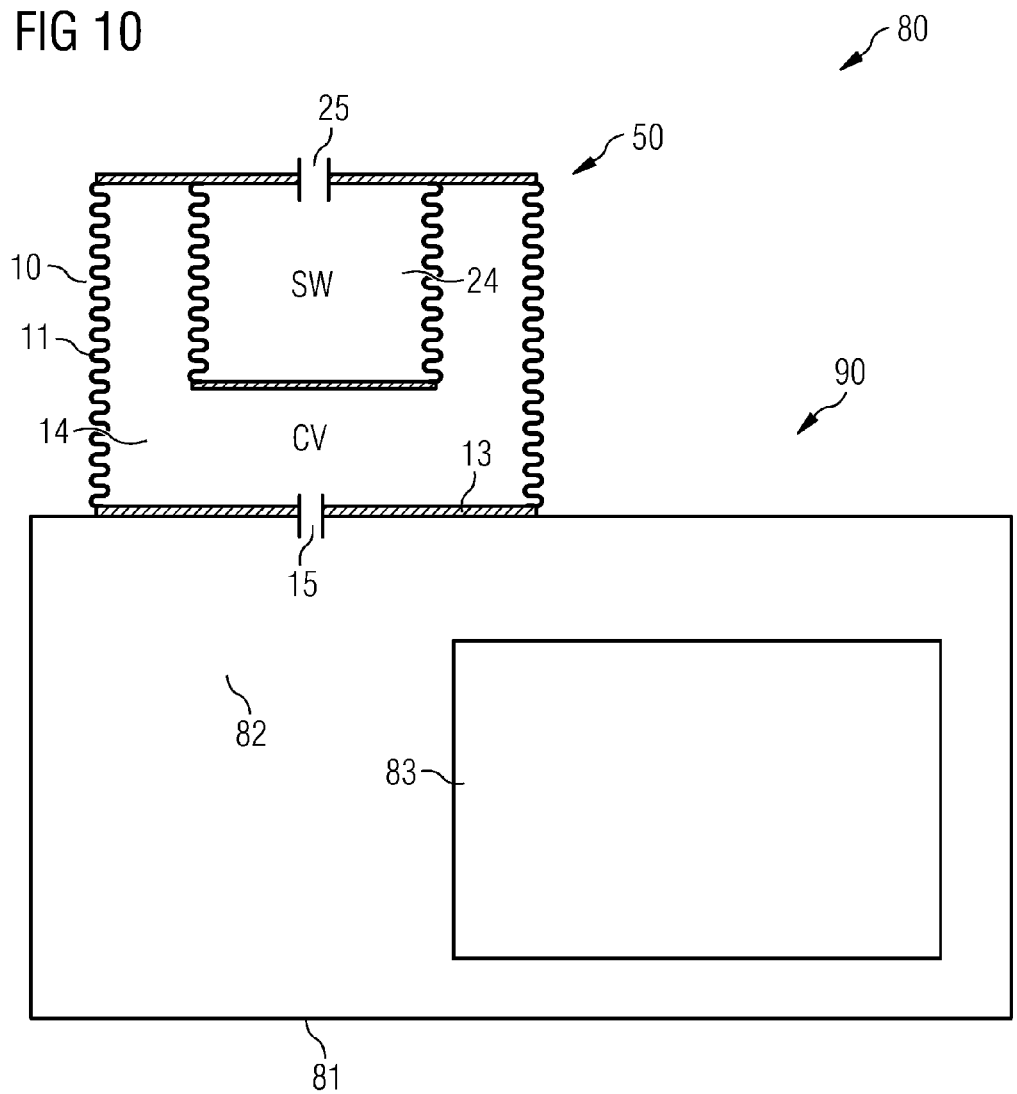
FIG. 10 is a schematic diagram illustrating a subsea device comprising a pressure compensator in accordance with one embodiment.

FIG. 10 illustrates a subsea device 80 in accordance with one embodiment. Subsea device 80 comprises an enclosure 81 enclosing a volume 82 which is filled with liquid, in particular dielectric liquid. An electric component 83 is submersed in the liquid filling volume 82. Subsea device 80 further comprises a pressure compensator 50. Note that although in FIG. 10, pressure compensator 50 has the configuration as illustrated in FIG. 2, any of the configurations of the pressure compensator 50 described herein may be used in the subsea device 80. The liquid in volume 82 can enter the compensation volume 14 of pressure compensator 50 through the first fluid connection 15. The ambient medium 90 which surrounds the subsea device 80 when installed subsea, in particular seawater, can enter the second chamber 24 of the inner bellow 20 via the second fluid connection 25.

Mounting plate 13 can be a metal plate which is part of the pressure compensator 50, in particular part of the outer bellow 10. In other configurations, mounting plate 13 may be part of the enclosure 81 of subsea device 80, it may in particular be a wall of the enclosure 81. In some configurations, the mounting plate 13 may thus be mounted to a wall of enclosure 81, e.g. by bolting or welding mounting plate 13 onto the wall, while in other configurations, the bellow portion 11 may be directly welded to a wall of enclosure 81.

The first fluid connection 15 may be a simple opening in the mounting plate 13 and the respective wall of the enclosure 81, i.e. a penetration through the material layers separating the compensation volume 14 from volume 82. As described further above, other embodiments may use a pipe or tubing for connecting the compensation volume 14 to volume 82.

In operation, the mounting plate 13 is generally stationary, as it is mounted to the enclosure of the subsea device, whereas the cover plate is moving during volume compensation. The outer cover plate 12 and the inner cover plate 22 move independent from each other, and generally in opposite direction during operation, as outlined with respect to FIGS. 7a to 7c.

The above embodiments provide a pressure compensator that is cost-efficient to produce, while at the same time provides a high utilization factor and has only a limited size and weight. The utilization factor of the pressure compensator may be increased to about 60%, or even more. The volume of unused liquid can be reduced at the same time. Since formed metal bellows can be employed in the pressure compensator, resistivity to corrosion and an extended lifetime are further benefits that can be achieved.

What is claimed is:

1. A pressure compensator for a subsea device for performing a pressure compensation between an ambient medium surrounding the subsea device and a liquid medium filling a volume of the subsea device, the pressure compensator comprising:
   at least one outer bellow;
   a first chamber enclosed by said outer bellow;
   at least one inner bellow, the inner bellow being arranged inside the first chamber;
   a second chamber enclosed by the inner bellow;
   a compensation volume confined between the outer bellow and the inner bellow;
   a first fluid connection from the compensation volume towards the volume of the subsea device, the first fluid connection enabling passage of the liquid medium between the compensation volume and the volume of the subsea device; and
   a second fluid connection to the second chamber, the second fluid connection enabling passage of the ambient medium into and out of the second chamber.

2. The pressure compensator of claim 1, wherein the outer bellow comprises an outer cover plate and a bellow portion having two openings, the bellow portion being liquid tight sealed against the outer cover plate at one opening and against a mounting plate which forms part of the outer bellow or of the subsea device at the other opening.

3. The pressure compensator of claim 2, wherein the inner bellow comprises an inner cover plate and a bellow portion having two openings, wherein the bellow portion of the inner bellow is liquid tight sealed against the inner cover plate at one opening and, at the other opening, is liquid tight sealed against one of the mounting plate or the outer cover plate of the outer bellow.

4. The pressure compensator of claim 3, wherein the bellow portion of the inner bellow is sealed against the mounting plate, and wherein the second fluid connection comprises one or more openings in the mounting plate located within an area of the mounting plate that is surrounded by the bellow portion of the inner bellow.

5. The pressure compensator of claim 1, wherein the outer bellow comprises an outer cover plate, and wherein the inner bellow comprises a bellow portion that is sealed against the outer cover plate, wherein the second fluid connection comprises one or more openings in the outer cover plate located within an area of the outer cover plate that is surrounded by the bellow portion of the inner bellow.

6. The pressure compensator of claim 1, wherein the outer bellow comprises a bellow portion, the bellow portion being liquid tight sealed against a mounting plate forming part of the outer bellow or of the subsea device, wherein the first fluid connection comprises a fluid passage through the mounting plate.

7. The pressure compensator of claim 1, wherein the at least one outer bellow is a formed metal bellow.

8. The pressure compensator of claim 1, wherein the at least one inner bellow is a formed metal bellow.

9. The pressure compensator of claim 7, wherein the formed metal bellow comprises a bellow portion that is made from a metal sheet formed into a cylindrical shape and provided with corrugations having crests which extend in circumferential direction of the cylindrical shape.

10. The pressure compensator of claim 1, wherein the at least one outer bellow comprises a first outer bellow and a second outer bellow arranged within the first outer bellow, wherein the first outer bellow and the second outer bellow confine a first intermediate volume, wherein the first outer bellow provides a liquid tight seal between the first intermediate volume and the ambient medium, and wherein the second outer bellow provides a liquid tight seal between the first intermediate volume and the compensation volume.

11. The pressure compensator of claim 1, wherein the at least one inner bellow comprises a first inner bellow and a second inner bellow arranged within the first inner bellow, wherein the first inner bellow and the second inner bellow confine a second intermediate volume, wherein the first inner bellow provides a liquid tight seal between the second intermediate volume and the compensation volume, and wherein the second inner bellow provides a liquid tight seal between the second intermediate volume and the ambient medium.

12. The pressure compensator of claim 1, comprising at least two inner bellows arranged inside the first chamber, each of the two inner bellows enclosing a chamber and comprising a fluid connection to enable the passage of ambient medium into the respective chamber, the at least two inner bellows being arranged adjacent to each other.

13. The pressure compensator of claim 1, further comprising:
at least a third bellow, the third bellow being arranged in the second chamber and enclosing a third chamber, and
a third fluid connection between the compensation volume and the third chamber, the third fluid connection being enabling passage of the liquid medium between the compensation volume and the third chamber.

14. The pressure compensator of claim 1, wherein the ambient medium is sea water, wherein the outer bellow is on its outer side in contact with the sea water when the pressure compensator is installed subsea, and wherein the second fluid connection is configured to enable the passage of sea water into the second chamber so that the second chamber is filled with sea water when the pressure compensator is installed subsea.

15. A subsea device, comprising:
an enclosure enclosing a volume filled with a liquid medium; and
a pressure compensator for performing a pressure compensation between an ambient medium surrounding the subsea device and the liquid medium filling the volume, the pressure compensator comprising:
at least one outer bellow;
a first chamber enclosed by said outer bellow;
at least one inner bellow, the inner bellow being arranged inside the first chamber;
a second chamber enclosed by the inner bellow;
a compensation volume confined between the outer bellow and the inner bellow;
a first fluid connection from the compensation volume towards the volume of the subsea device, the first fluid connection enabling passage of the liquid medium between the compensation volume and the volume of the subsea device; and
a second fluid connection to the second chamber, the second fluid connection enabling passage of the ambient medium into and out of the second chamber.

* * * * *